(12) United States Patent
Beier et al.

(10) Patent No.: US 7,282,930 B2
(45) Date of Patent: Oct. 16, 2007

(54) DEVICE FOR TESTING THIN ELEMENTS

(75) Inventors: Uwe Beier, Ottendorf-Okrilla (DE); Dietmar Runge, Grosserkmannsdorf (DE); Stefan Kreissig, Venusberg (DE); Steffen Grauer, Strehla (DE); Matthias Rottka, Grossenhain (DE); Botho Hirschfeld, Dresden (DE); Joerg Kiesewetter, Thiendorf OT Sacka (DE)

(73) Assignee: Suss Microtec Test Systems GmbH, Sacka (DE)

( * ) Notice: Subject to any disclaimer, the term of this patent is extended or adjusted under 35 U.S.C. 154(b) by 0 days.

(21) Appl. No.: 11/314,624

(22) Filed: Dec. 21, 2005

(65) Prior Publication Data
US 2007/0139067 A1 Jun. 21, 2007

(51) Int. Cl.
*G01R 31/302* (2006.01)

(52) U.S. Cl. .................. 324/752; 324/750; 324/754; 324/765

(58) Field of Classification Search .............. 324/750, 324/752, 754, 765
See application file for complete search history.

(56) References Cited

U.S. PATENT DOCUMENTS

| 4,864,227 | A | * | 9/1989 | Sato .......................... 324/758 |
| 5,493,236 | A | | 2/1996 | Ishii et al. ................... 324/752 |
| 5,959,461 | A | * | 9/1999 | Brown et al. ................. 324/765 |
| 6,056,863 | A | * | 5/2000 | Gyota et al. ................. 205/118 |
| 6,086,453 | A | * | 7/2000 | Fukuoka et al. ............... 451/5 |
| 6,483,336 | B1 | * | 11/2002 | Harris et al. ................. 324/765 |
| 6,515,494 | B1 | * | 2/2003 | Low ........................... 324/752 |
| 6,559,670 | B1 | * | 5/2003 | Motamedi .................... 324/765 |
| 7,022,985 | B2 | * | 4/2006 | Knebel et al. ............... 250/306 |
| 7,034,563 | B1 | * | 4/2006 | Souchkov et al. ........... 324/765 |
| 2005/0122125 | A1 | * | 6/2005 | Dunklee et al. ............. 324/754 |

* cited by examiner

*Primary Examiner*—Ha Tran Nguyen
*Assistant Examiner*—Arleen M. Vazquez
(74) *Attorney, Agent, or Firm*—Heslin Rothenberg Farley & Mesiti P.C.

(57) ABSTRACT

A device for testing thin elements, such as wafers or individual substrates, while at the same time offering a facility for inspecting the reverse side of the thin elements is provided in which any deflection of the substrate as a consequence of high contact power of the probe card is avoided and which is also suitable for substrate diameters of 200 mm and above. The device includes a stable plate with a central opening positioned on the basic construction, a frame which can be moved and/or turned on the plate in an x/y direction and, if required, in a theta direction, a highly-rigid substrate support which can be mounted in the frame, and substrates which can be mounted on the substrate support, wherein the mounting is effected through a vacuum, using mechanical elements (clamping ring, clamping foil or other suitable clamping elements), gel pack pads, or adhesive etc.

24 Claims, 6 Drawing Sheets

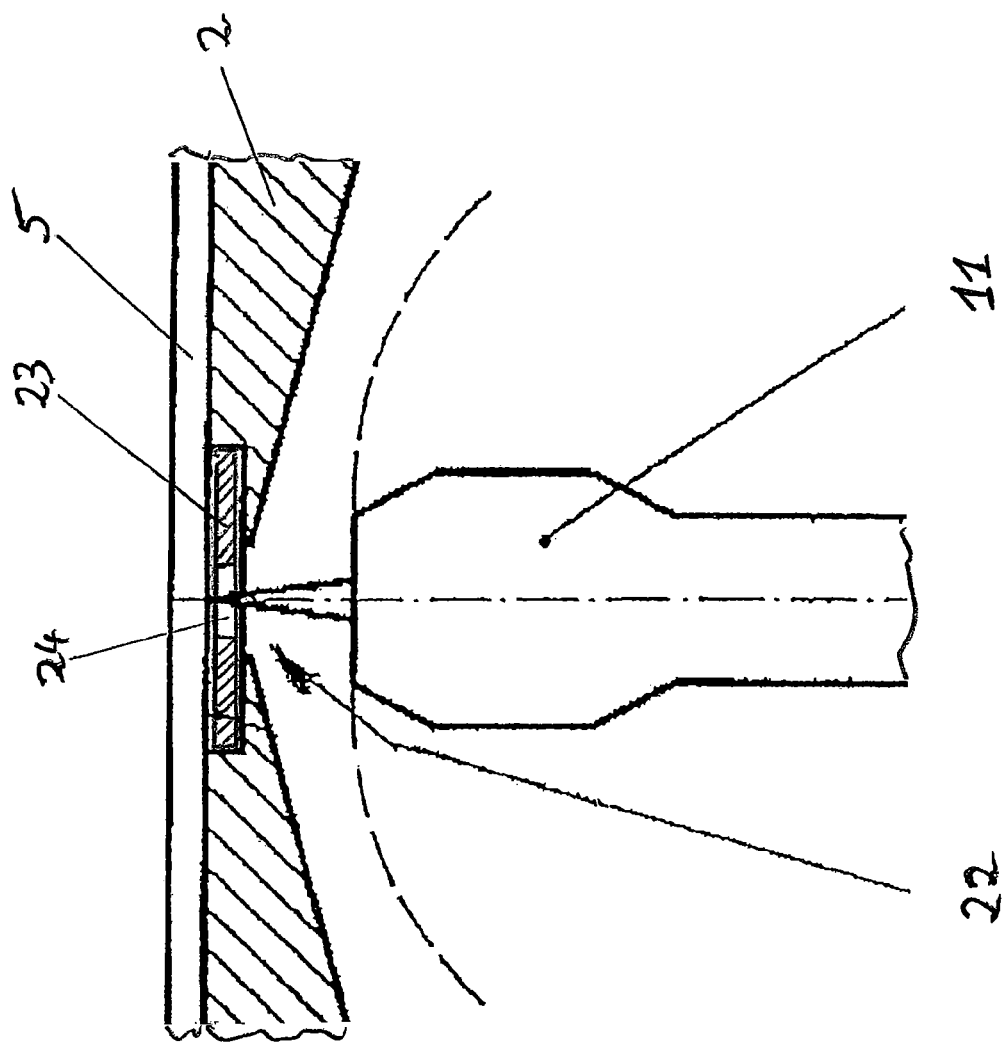

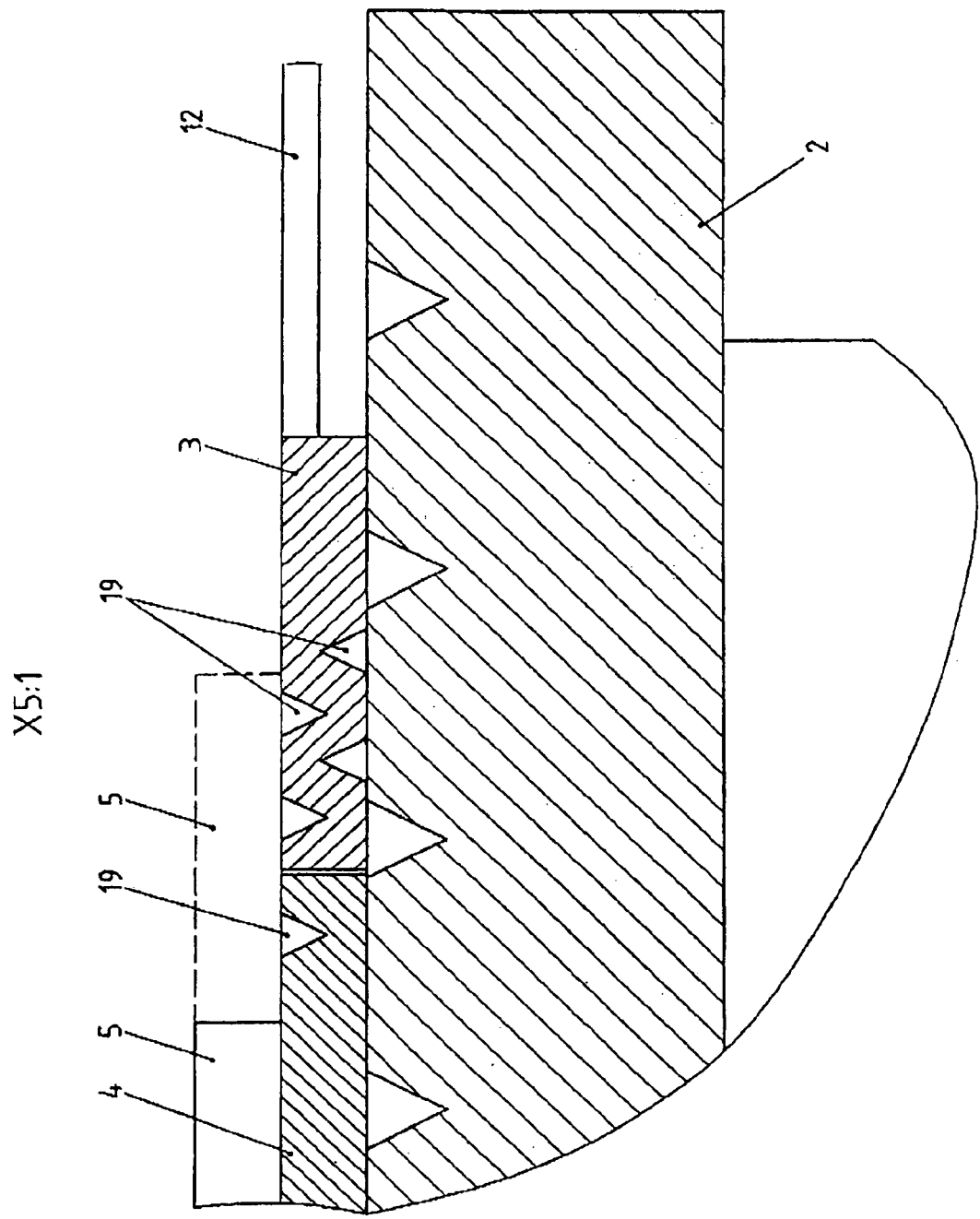

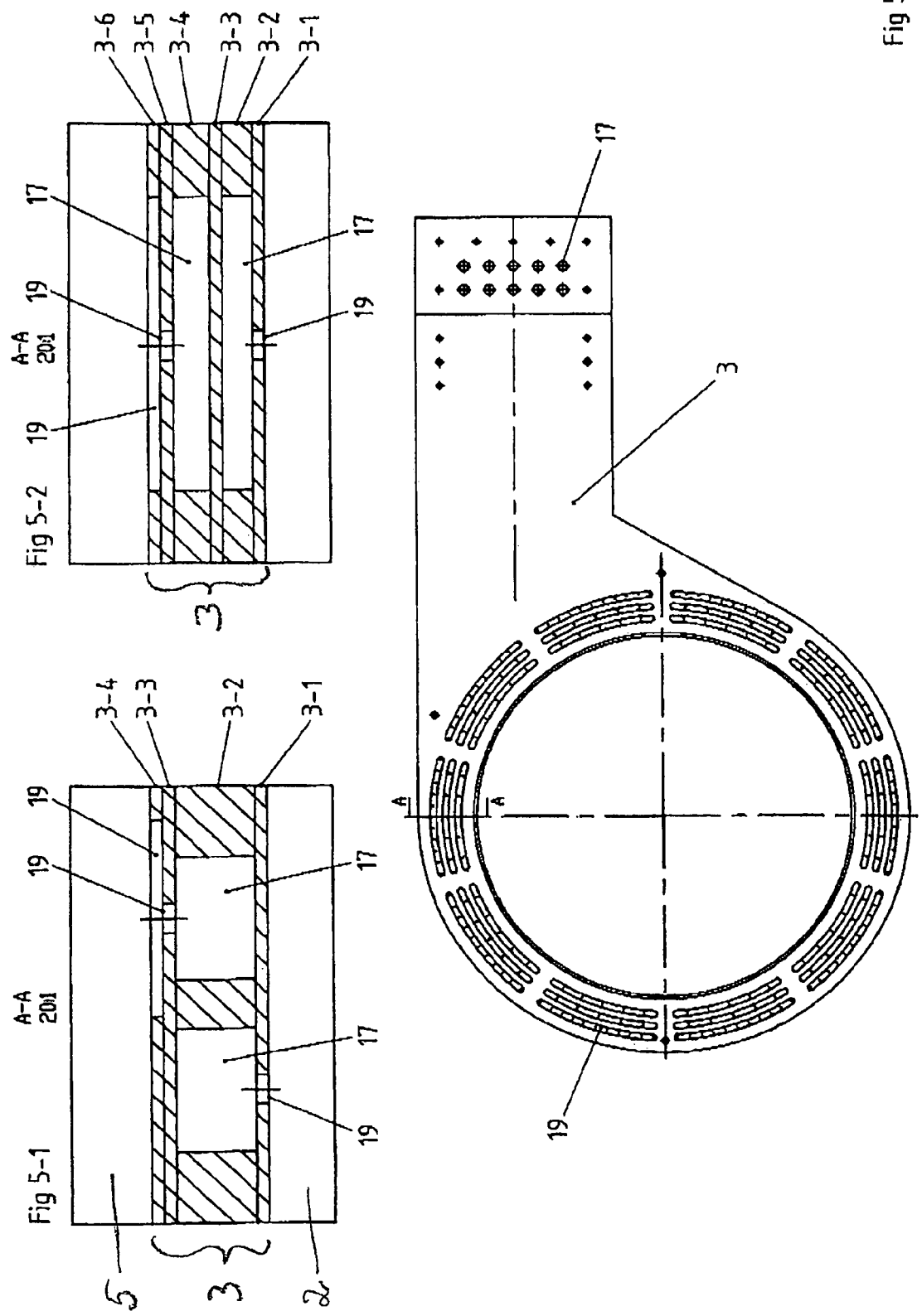

DEVICE FOR TESTING THIN ELEMENTS

BACKGROUND OF THE INVENTION

The invention involves a device for testing thin elements, such as wafers or individual substrates, while at the same time offering a facility for inspecting the reverse side of the thin elements.

FIG. 1 shows a normal device using state-of-the-art technology with a base plate 2 (ideally made from steel) which can be moved in an x/y direction, and with a central opening in which a substrate support 4 is inserted in the form of a thin glass plate. A substrate 5, e.g. a wafer, wafer parts or even individual substrates, is deposited on the substrate support and taken in/fixed to the edge on the outside of the glass plate via vacuum channels 18 located in the base plate.

In the middle under the opening is an inspection device, preferably an adjustable emission microscope 11 or similar.

Above the base plate 2 is a device 6 for making contact with the DUT (device under test), e.g. a probe card, probe head (probe manipulator, print module which is mounted in a probe holding plate 9 via a probe card adapter 7. The probe holding plate 9 can execute a manual or motor-driven vertical movement—via a separation device 16—for bringing the probes of the probe card 6 into contact with the substrate and for lifting the probe card 6 from the substrate 5 during x/y positioning of the base plate 2. Optionally, probe heads can also be used in place of the probe card. The heads are positioned on the probe holding plate 9 (SHP) and can be used to create special ambient conditions for the DUT.

The U.S. Pat. No. 5,493,236 C also shows a sampler on which the substrate to tested (wafer), depending on its circumference, sits on a wafer support so that the remaining area of the reverse side of the wafer is free for an inspection device. The substrate is contacted by the needles of a probe card from the upper surface. This sampler is only suitable for inspecting small substrates, or comparatively low needle forces may be applied so that the substrate is not deflected. A high deflection of the substrate support and/or of the substrate as a consequence of high contact forces exercised by the probe card would be particularly disadvantageous. Furthermore, such a device is entirely unsuitable for substrate diameters of 200 mm and above.

Finally, with the devices described, the edge of the substrate is required for secure fixing on the base plate, and therefore cannot be included in the inspection.

BRIEF SUMMARY OF THE INVENTION

The invention is based on the task of creating a device for testing thin elements, where each deflection of the substrate due to high contact force of the probe card is avoided, and where the device is also suitable for substrate diameters of 200 mm and above.

With a device of the type referred to at the beginning, the task on which the invention is based is resolved by a stable plate with a central drill hole/opening positioned on the basic construction, a frame positioned on the plate which—in a beneficial form of design of the invention—can be moved and/or turned—either manually or motor-driven—in an x/y direction and, if required, in a theta direction. A highly rigid substrate support can be attached to the frame, and, in turn, substrates mounted on the substrate support, by means of a vacuum, using mechanical elements (clamping ring, clamping foil or similar suitable clamping elements), gel pack pads, adhesive etc.

The substrate support will ideally consist of a glass plate, or another clear material of sufficient rigidity.

A special form of the invention is characterized by the fact that the drill hole/opening in the base plate only releases one substrate section to strengthen the rigidity of the system and enable high probe forces without deflecting the substrate.

In a further form of the invention, an air cushion can be created between the base plate and the substrate support to enable slight movement, for example for positioning the substrate relative to the contacting device and the inspection device. Furthermore, a holding force can be created between the base plate and the substrate support by means of a vacuum for secure mounting during measuring or testing.

Alternatively, and in addition to the forms described above, the base plate can be coated to enable the substrate support to glide easily on the base plate.

The task on which the invention is based is resolved with a device of the type referred to at the beginning by means of a stable plate located on the basic construction with a central drill hole/opening and a frame positioned on the plate. In turn, substrates are mounted in the frame using a frame geometrically coordinated to the substrate or by means of mechanical elements (clamping ring, clamping foil or similar suitable clamping elements), gel pack pads or adhesive.

If, as in this alternative solution, there is no substrate support, direct contact, and thus minimal working distance, can be created between the substrate and the emission microscope. With thin substrates, the necessary rigidity for any high probe forces that may be required can be created if the stable plate has a sufficiently small opening.

In a further form of the invention, a substrate support can also be positioned in the disc, and therefore under the frame. The use of a substrate holder is determined by the facilities for fixing the substrate to be tested, the rigidity of the substrate itself, and the probe forces to be applied. The substrate holder can also be a glass plate or some other clear material which allows inspection from the lower side.

Here, too, in certain designs measures can be taken which will allow slight movement of the frame on the base plate by an air cushion or a coating of the base plate and a holding force created by a vacuum for securing the frame and therefore the substrate. Similarly, in a beneficial form of design of the invention, the frame can be moved and/or turned—either manually or motor-driven—in an x/y direction and, if required, in a theta direction.

In a continuation of the design, the frame can be split in a lateral direction to facilitate the insertion of substrates. If the frame is closed—which could be done, for example, by means of a pneumatic linear unit or a manual clamping device—then the substrate is fixed in the frame and can be moved with the frame without any play.

A special form of the invention is characterized by the fact that inserts in the central inspection opening in the base plate can be used to adjust the diameter of the inspection opening to the measuring task.

In a particularly beneficial, versatile and low-cost variant of the invention, the frame is of a multi-layered construction formed of layers with incorporated compressed air or vacuum feed lines and compressed air or vacuum channels. The individual layers of the frame can easily be interconnected by sticking or welding them together or, alternatively, by using magnetic force.

The principle of the invention is that the device enables thin, sensitive elements such as wafers to be inspected from both sides or from the rear; it also allows simultaneous inspection of multiple individual substrates.

The particularly advantageous design of the individual components means that it is possible to apply very high forces to the thin element, such as thinned wafers/substrates (probe forces, pressure differences), without having to be concerned about damaging the thin elements. Wafers can still be fully inspected when clamped, i.e. even the edge areas can be included without additional measures, whilst at the same time several individual substrates can be positioned next to each other and inspected.

To summarize, it may be said that the principle of the invention is that the device for testing thin elements is suitable for large, very thin or sensitive measuring objects (including with a high contact force), and that the reverse side can be inspected without any problems.

The invention also includes combinations of forms of design and features which an expert, on the basis of his or her specialist knowledge, would use for special tasks.

BRIEF DESCRIPTION OF THE FIGURES OF THE DRAWINGS

The invention is explained in greater detail below in terms of its design. The accompanying drawings show:

FIG. 3.1: an enlarged view of the central part of FIG. 3;

FIG. 4: the detailed representation of X from FIG. 2 with compressed air or vacuum channels in both the base plate and the frame;

FIG. 5: is a top view of a frame with compressed air vacuum channels;

FIG. 5-1: a cross-sectional view of a multi-layer frame made of thin sheet steel with compressed air or vacuum channels positioned next to each other on the same level along line A-A in FIG. 5; and FIG. 5-2: a cross-sectional view of a multi-layer frame made of thin sheet steel with compressed air or vacuum channels positioned at different levels along line A-A in FIG. 5.

DETAILED DESCRIPTION

Figure 2:
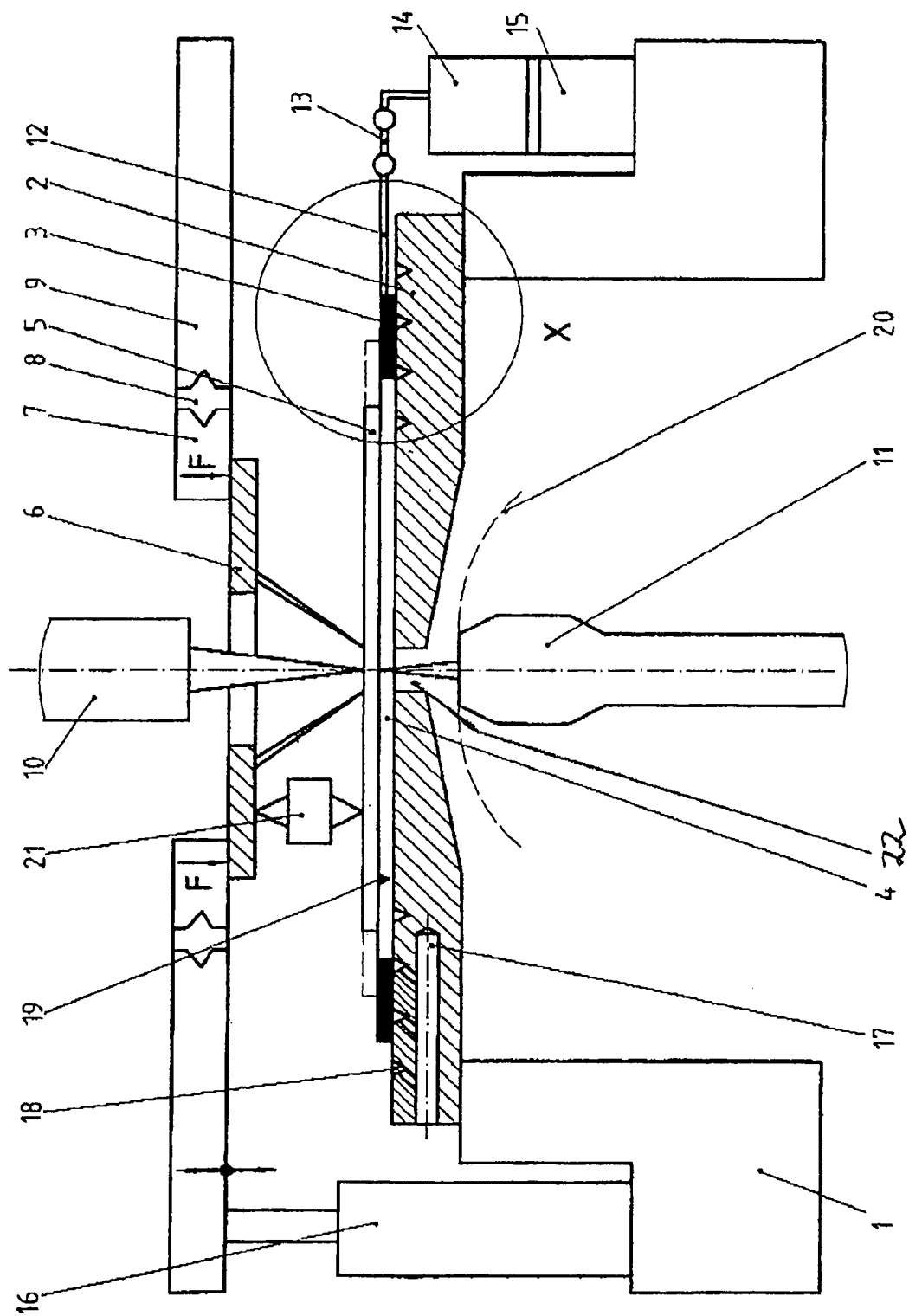
FIG. 2: a device, in accordance with the principle of the invention, for testing thin elements (e.g. substrates or wafers) with a high degree of rigidity and a substrate support—with a substrate mounted on it—which is held in a frame and which can be moved at least in an X- and Y direction on a base plate.

FIG. 2 shows a device, in accordance with the principle of the invention, for testing highly-rigid thin substrates 5 or wafers with an overlying substrate holder 4- and substrate 5 mounted on it—held in a frame 3 and which can be moved, at least in an X- and Y direction, on a base plate. The substrate 5 could be in the form of wafers, wafer parts or even individual substrates.

The device is based on a stable basic construction 1, on which a base plate 2, preferably made of steel, is positioned. This base plate 2 has a central inspection opening 22 through which the reverse side of the substrate 5 can be inspected through a suitable inspection device 11. The inspection device 11 (e.g. an emission microscope) can be swiveled away from the inspection area so that the inspection opening 22 is freely accessible. The swiveling range of the inspection device 11 is designated by reference number 20.

The substrate support 4 comprises a (ideally) thin glass plate around 2 mm thick which has a dual-sided coating in accordance with the measuring task. This substrate support 4 is held by a (ideally steel) frame 3 which is connected to an X- and Y axis 14, 15 by means of a coupler 12 and joint 13 to allow horizontal movement. The frame 3 is about the same thickness as the substrate support 4.

The horizontal movement of the frame 3 can be controlled by a planar drive mechanism for the X- and Y axis 14, 15 combined in a unit, or manually using auxiliary power.

The joint 13, which links the frame 3 to the X-/Y axis 14, 15, is a joint 13 which operates horizontally and has the task of ensuring that, during movement of the frame 3, the only forces at work are those in an X- or Y direction so that there is absolutely no possibility of inadvertent lifting of the frame 3. Joint 13 could be a double joint or a solid joint (articulation through material deformation, i.e. through deflection of a thin junction). The coupling is designed so that it is free from play in an x- and y direction.

After reaching a prescribed X-/Y position, the frame 3 with the substrate support 4 can be fixed on the base plate 2 with the help of narrow channels 18 located in the base plate if the channels are evacuated via a vacuum/compressed air feed line 17. To facilitate movement of the frame 3 with the substrate support 4, compressed air can be blown into the narrow channels 18 via the compressed air feed line.

Likewise, the substrate 5 is mounted on the substrate support 4 through vacuum channels 19 incorporated into the substrate support 4. Additional vacuum channels 19 can be positioned in the frame 3, and also on its upper and lower sides, as shown in FIG. 4.

A special microscope 21 is provided for precise setting/adjustment of probe card 6 and substrate 5 in a lateral direction; the microscope can be inserted in the clearance between probe card 6 and substrate 5. This microscope can also consist of two microscopes, with one directed upwards, and the other downwards.

The probe card 6 is attached to a probe card adapter 7 of a probe holding plate 9 which can travel in a vertical direction and, at the same time, can be moved in a theta direction. A separation 16 is provided for manual or motor-driven vertical movement.

Above the probe card 6 is another microscope 10, ideally a light-optical microscope, so that the contacting process of probe card 6 can be observed.

Figure 3:
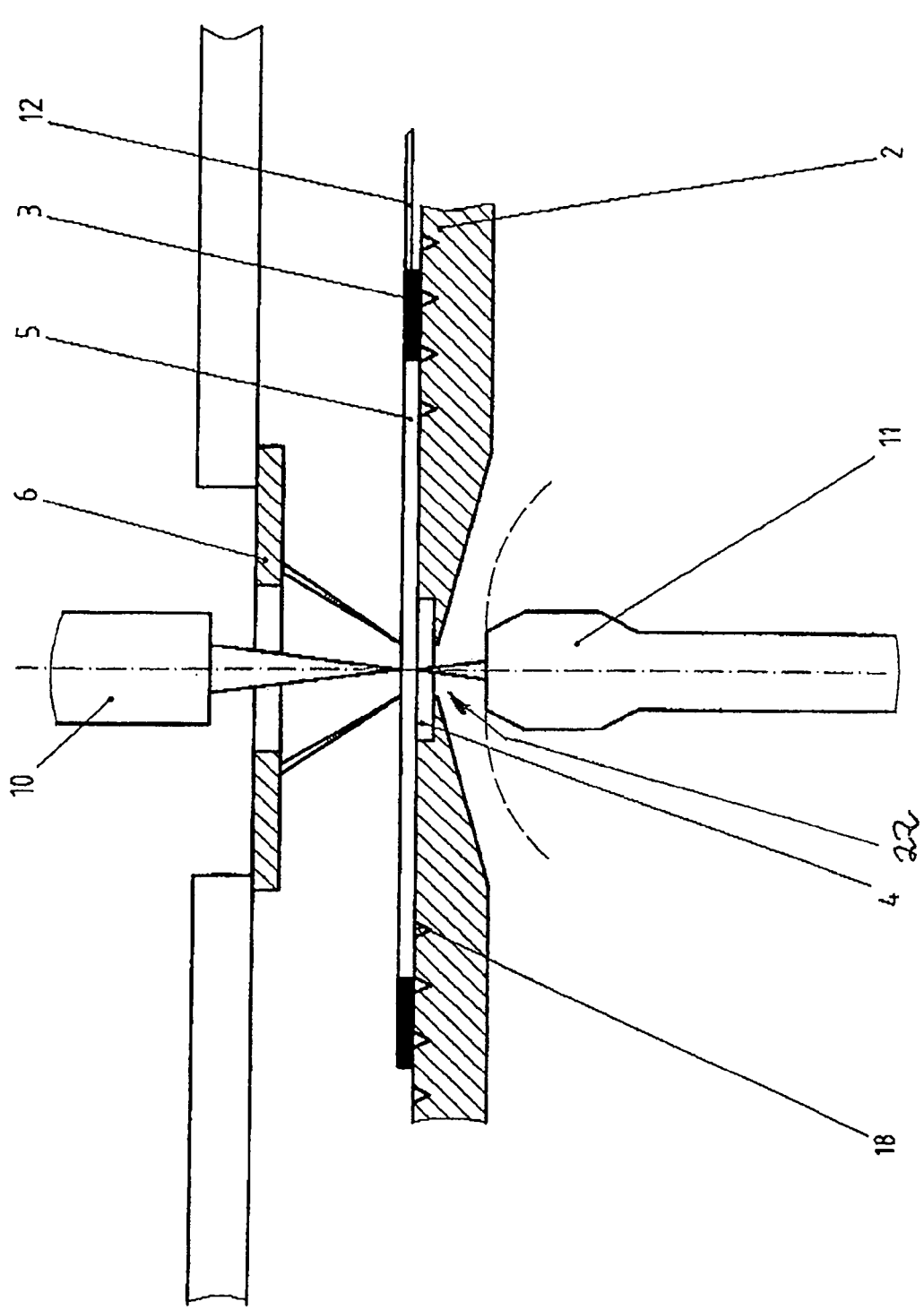
FIG. 3: a form of the device, in accordance with the principle of the invention, for testing thin elements (e.g. substrates or wafers) with a substrate support mounted on the base plate and a substrate held in a frame which is geometrically coordinated to the substrate.

FIG. 3 shows the most important elements of a design of the device, in accordance with the principle of the invention, for testing thin elements (e.g. substrates or wafers) with a substrate support 4 mounted on the base plate 2 and a substrate 5 held in a frame 3.

Here the substrate support 4 (e.g. a glass plate) is fixed directly to base plate 2. The substrate 5 to be examined is then mounted directly in a frame coordinated geometrically to the substrate, and moved using a coupler 12. So that the substrate 5 can be fixed by low pressure and, on the other hand, can be moved easily, channels 18 are incorporated into the base plate 2; these channels may be connected by either a low or high pressure source. The frame 3 can also be of a split design to facilitate insertion of the substrates 5. To insert a substrate, the frame must be opened and the substrate 5 inserted from the side. The frame must then be closed, for example by means of a pneumatic linear unit or a manual clamping device; the substrate 5 is fixed in the frame with which it moves free from play.

In the minimal form of the design, the substrate can be positioned and adjusted without any auxiliary means (including without frame 3) and fixed using the vacuum channels 18.

Depending on the measuring task, various materials may be used as the substrate 4, e.g. sapphire or undoped silicon.

The substrate support 4 can have a filter function. It is possible, of course, to use the device without a substrate support 4, in which case direct contact (minimal working distance) is enabled between the substrate and the emission microscope.

The inspection opening 22 in the base plate (FIG. 3) can be adjusted to various parameters using inserts. For example, as depicted in FIG. 3.1, the substrate support 4 can be replaced with an insert or adaptor 23 reducing the diameter of the inspection opening. This provides even better support for the wafer.

In the event that the optical systems of the emission microscope of the inspection device 11 has to be brought into direct contact with the substrate to be examined, the substrate support 4 can be omitted if the inspection opening 22 is sufficiently small. In such a case, high probe forces are possible without deflecting the substrate.

The insert can also perform the function of an optical visor. The geometry of the drill hole 24 in the insert 23 can be adapted to the measuring task, e.g. geometry of the DUT (device under test) etc.

Alternatively, a probe card 6, or even a pressure module, probe head or similar—which can be contacted with substrate 3 from the top—can be used as an alternative in both variants illustrated in FIGS. 2, 3.

FIG. 5 shows a top view of a particularly advantageous, versatile and low-priced variant of a frame 3 with a compressed air or vacuum feed within the frame. This involves an arrangement using layers 3-1 . . . 3-4 (FIG. 5-1) or 3-1 . . . 3-6 (FIG. 5-2) which would ideally be made of thin sheet steel.

Figure 1:
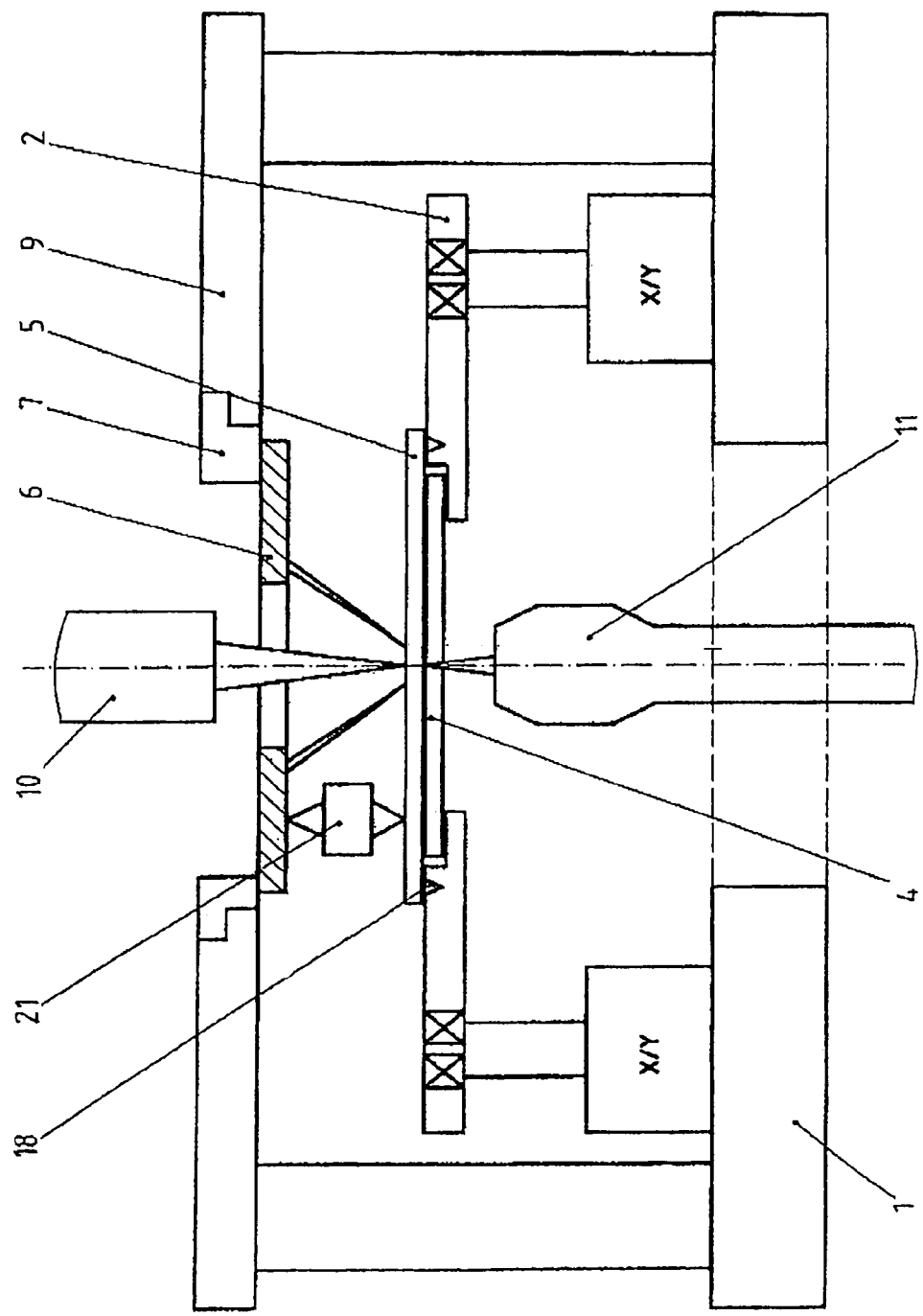
FIG. 1: a device for testing thin elements, with a facility for inspecting the reverse side and a substrate support made of glass with overlying substrate/wafer (state-of-the-art technology)

FIG. 5-1 shows a cross-sectional view of a frame 3 constructed of multiple layers of thin sheet steel with vacuum or compressed air feed lines 17 positioned next to each other on the same level along line A-A in FIG. 5.

FIG. 5-2 shows a cross-sectional view (along line A-A in FIG. 5) of a variant of a frame 3 constructed of multiple layers of thin sheet steel in which the vacuum or compressed air feed lines 17 run along different levels of layers 3-1 . . . 3-6.

The ideal strengths of the individual layers 3/1 . . . 3-n are in the range from around 100 μm to around 750 μm. The interconnection of the individual layers 3/1 . . . 3-n can be created, for example, by sticking or welding them together, using a magnetic force, or in some other way. The necessary vacuum or compressed air feed lines 17 can simply be inserted into layers 3-1 . . . 3-n by laser cutting or wire-cutting. The almost limitless opportunities for laser cutting or wire-cutting means that highly-complex vacuum or compressed air channel systems can be integrated into a very thin frame. The individual channels can be arranged independently of each other which, in turn, enables different pressure levels and streaming speeds to be created.

LIST OF REFERENCE NUMBERS

1 Basic construction
2 Base plate
3 Frame
4 3-1/3-2/3 -3/ . . . /layer construction of the frame
4 Substrate support
5 Substrate, e.g. wafer, wafer parts, individual substrates
6 Probe card
7 Probe card adapter
8 Theta movement for adjustment of probe card
9 Probe holding plate
10 Microscope
11 Inspection device
12 Coupler
13 Joint, horizontal
14 X axis (horizontal movement)
15 Y axis (horizontal movement)
16 Separation (vertical movement)
17 Vacuum/compressed air feed line
18 Compressed air or vacuum channels in the base plate
19 Compressed air or vacuum channels in the substrate support or frame
20 Swiveling range objective/inspection device
21 Special microscope for adjustment of the probe card/substrate
22 Central inspection opening

What is claimed is:

1. A device for testing thin elements, such as wafers or multiple individual substrates, while at the same time offering a facility for inspecting a back side of the thin elements, with a thermally stable, rigid basic construction, comprising:
    a stable base plate located on the basic construction and having a central inspection opening,
    an inspecting device for inspecting a back side of the thin element through the central opening,
    a frame positioned on the plate such that horizontal movement of the frame on and relative to the plate is allowed,
    a planar drive mechanism for controlling the horizontal movement of the frame,
    a highly-rigid substrate support held in the frame,
    first means for mounting the thin element on the substrate support, wherein mounting of the thin element on the substrate support is effected by a vacuum, or using mechanical elements, gel pack pads, or adhesive, and
    second means to selectively fix the frame and the substrate support on and relative to the base frame, and third means to selectively facilitate movement of the frame and substrate support on and relative to the base plate.

2. Device in accordance with claim 1, wherein the substrate support comprises a glass plate or other transparent material.

3. Device in accordance with claim 1, wherein the opening in the base plate releases only one section of the thin element.

4. Device in accordance with claim 1, wherein the third means comprises means for creating an air cushion between the base plate and the substrate support for ease of movement, and the second means exhibits high holding power by creating a vacuum for secure fixing during a measuring/test.

5. Device in accordance with claim 1, wherein the base plate has a coating which enables the substrate support and the frame to glide easily on and relative to the base plate.

6. Device in accordance with claim 1, further comprising means for moving and/or turning the frame, either manually or motor-driven, in an x/y direction and in a theta direction.

7. Device in accordance with claim 1, further comprising inserts selectively mountable in the central inspection opening in the base plate to adjust a diameter of the inspection opening to a measuring task.

8. Device in accordance with claim 1, wherein the frame is constructed from multiple layers with incorporated compressed air or vacuum feed lines and compressed air or vacuum channels.

9. Device in accordance with claim 8, wherein individual layers of said multiple layers are interconnected by sticking or welding them together or, by using magnetic force.

10. Device according to claim 1, wherein the frame is coupled to the planar drive mechanism by a coupler and a joint which operates horizontally.

11. Device according to claim 10, wherein the joint is a solid joint with a thin junction.

12. A device for testing thin elements, such as wafers or multiple individual substrates, while at the same time offering a facility for inspecting a back side of the thin elements, with a thermally stable, rigid basic construction, comprising:
a stable base plate located on the basic construction and having a central inspection opening,
an inspection device for inspecting a back side of the thin element through the central opening,
a frame positioned on the plate such that horizontal movement of the frame on and relative to the plate is allowed,
a planar drive mechanism for controlling the horizontal movement of the frame,
a highly-rigid substrate support held in the frame,
first means to hold the thin element in the frame by form-locking or using mechanical elements, gel pack pads or adhesive, and
second means to selectively fix the frame and the substrate support on and relative to the base frame, and third means to selectively facilitate movement of the frame and substrate support on and relative to the base plate.

13. Device in accordance with claim 12, wherein the substrate support is mounted in the base plate.

14. Device in accordance with claim 13, wherein the substrate support comprises a glass plate or other clear or transparent material.

15. Device in accordance with claim 12, wherein the opening in the base plate only releases one section of the thin element.

16. Device in accordance with claim 12, wherein the third means further comprises means for creating an air cushion between the base plate and the thin element.

17. Device in accordance with claim 12, wherein the base plate has a coating which enables the frame and the thin element to glide easily on and relative to the base plate.

18. Device in accordance with claim 12, further comprising means for moving and/or turning the frame, either manually or motor-driven, in an x/y direction and in a theta direction.

19. Device in accordance with claim 12, wherein the frame has a split construction allowing the frame to be opened to receive the thin element from a side and then closed to hold the thin element.

20. Device in accordance with claim 12, further comprising inserts selectively mountable in the central inspection opening in the base plate to adjust a diameter of the inspection opening to a measuring task.

21. Device in accordance with claim 12, wherein the frame is constructed from multiple layers with incorporated compressed air or vacuum feed lines and compressed air or vacuum channels.

22. Device in accordance with claim 21, wherein individual layers of the multiple layers are interconnected by sticking or welding them together or by using magnetic force.

23. Device in accordance with claim 12, wherein the frame is coupled to the planar drive mechanism by a coupler and a joint which operates horizontally.

24. Device according to claim 23, wherein the joint is a solid joint with a thin junction.

* * * * *